(12) United States Patent
Su et al.

(10) Patent No.: US 9,048,427 B2
(45) Date of Patent: Jun. 2, 2015

(54) THIN FILM FABRICATION OF RUBBER MATERIAL WITH PIEZOELECTRIC CHARACTERISTICS

(71) Applicant: National Tsing Hua University, Hsinchu (TW)

(72) Inventors: Yu-Chuan Su, Hsinchu (TW); Jhih-Jhe Wang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 280 days.

(21) Appl. No.: 13/787,722

(22) Filed: Mar. 6, 2013

(65) Prior Publication Data

US 2014/0252915 A1    Sep. 11, 2014

(51) Int. Cl.

| H01L 41/04 | (2006.01) |
|---|---|
| H01L 41/22 | (2013.01) |
| H01L 41/27 | (2013.01) |
| H01L 41/333 | (2013.01) |
| H01L 41/45 | (2013.01) |
| H01L 41/193 | (2006.01) |

(52) U.S. Cl.
CPC .............. *H01L 41/333* (2013.01); *H01L 41/45* (2013.01); *H01L 41/193* (2013.01)

(58) Field of Classification Search
CPC .... G01P 15/0802; B82Y 10/00; B82Y 15/00; G01N 27/414; B31C 1/00246
USPC ........... 310/311, 358, 365, 800; 245/414–417
See application file for complete search history.

(56) References Cited

U.S. PATENT DOCUMENTS

| 8,269,401 | B1 * | 9/2012 | Kim et al. ..................... 310/339 |
| 8,803,406 | B2 * | 8/2014 | Lee et al. ..................... 310/339 |
| 2003/0207911 | A1 * | 11/2003 | Nettekoven et al. ........... 514/303 |
| 2004/0121528 | A1 * | 6/2004 | Krulevitch et al. ........... 438/166 |
| 2013/0022868 | A1 * | 1/2013 | Yang et al. ..................... 429/217 |

* cited by examiner

*Primary Examiner* — Thomas Dougherty
(74) *Attorney, Agent, or Firm* — McClure, Qualey & Rodack, LLP

(57) ABSTRACT

The present invention is related to a thin film fabrication of a rubber material with piezoelectric characteristics and a manufacturing method thereof. The present invention is developed by utilizing polymer casting, multilayer stacking, surface coating, and micro plasma discharge processes. To realize the desired electromechanical sensitivity, cellular PDMS structures with micrometer-sized voids are implanted with bipolar charges on the opposite inner surfaces. The implanted charge pairs function as dipoles, which respond promptly to diverse electromechanical simulation.

15 Claims, 20 Drawing Sheets

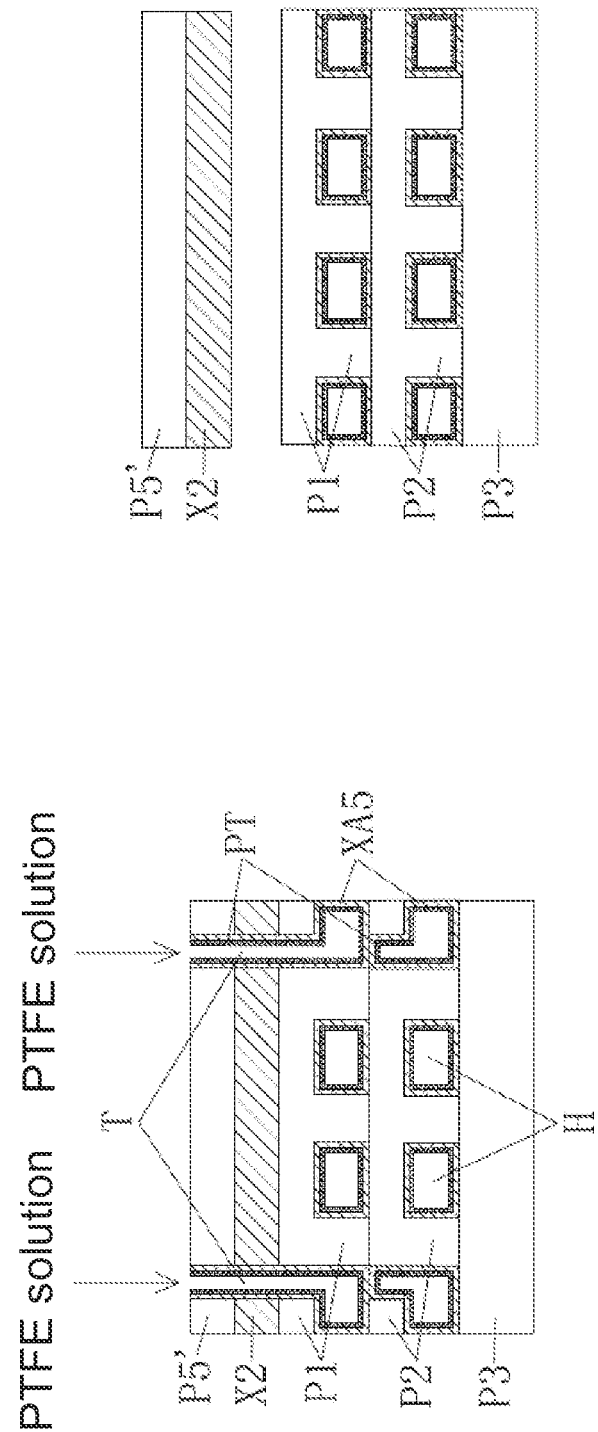

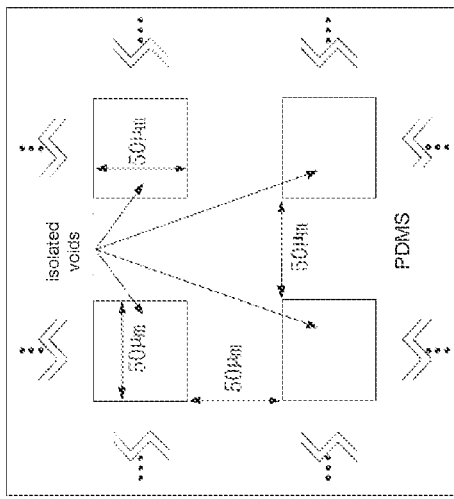
Fig. 5A
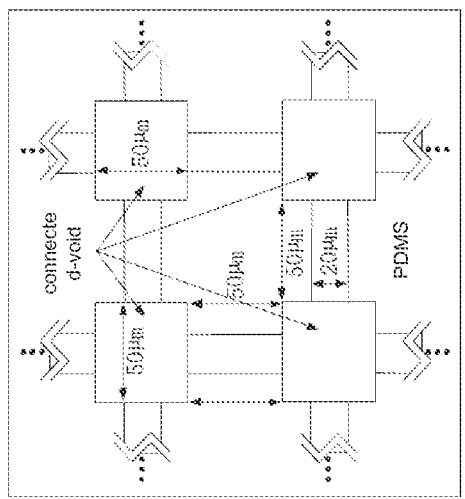
Fig. 5B
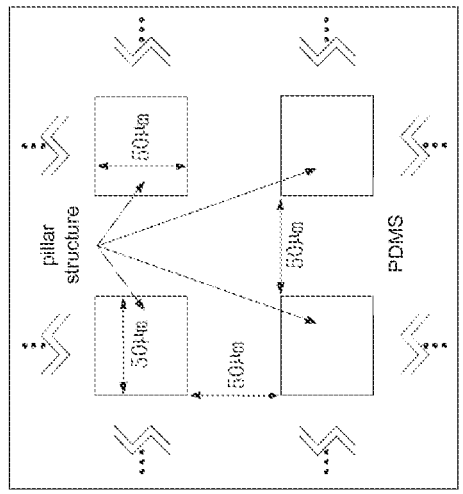
Fgi. 5C

THIN FILM FABRICATION OF RUBBER MATERIAL WITH PIEZOELECTRIC CHARACTERISTICS

BACKGROUND OF THE INVENTION

1. Field of the Invention

The present invention generally relates to a thin film fabrication of a rubber material with piezoelectric characteristics and a manufacturing method thereof, more particularly to a thin film fabrication that is developed by utilizing polymer casting, multilayer stacking, surface coating, and micro plasma discharge processes.

2. Description of the Prior Art

In prior arts, to produce the desired cellular structures, most ferroelectrets are formed utilizing a modified film blow and extrusion process. Before film blowing, spherical voids with diameters about 10 µm are generated by gas injection into the polymer melt. The melt is extruded into a tube which is cooled down and reheated for film blowing. Film formation is accompanied by biaxial orientation, which results in disk- or lens-shaped voids. Unfortunately, the results are usually ill-controlled in both individual void geometry and overall cellular structure, owing to the polydispersity resulting from the fabrication processes. It is difficult to control the cellular structures and therefore the properties of the fabricated ferroelectrets, or to further integrate them with common microsystems.

A US patent, numbered U.S. Pat. No. 8,217,381 and called Controlled Buckling Structures in Semiconductor Interconnects and Nanomembranes for Stretchable Electronics, discloses the technology listed below:

the present invention provides stretchable, and optionally printable, components such as semiconductors and electronic circuits capable of providing good performance when stretched, compressed, flexed or otherwise deformed, and related methods of making or tuning such stretchable components. Stretchable semiconductors and electronic circuits preferred for some applications are flexible, in addition to being stretchable, and thus are capable of significant elongation, flexing, bending or other deformation along one or more axes. Further, stretchable semiconductors and electronic circuits of the present invention are adapted to a wide range of device configurations to provide fully flexible electronic and optoelectronic devices.

With references to FIG. 8A and FIG. 8C, FIG. 8B and FIG. 8D, which illustrate a schematic view of a method for fabricating a smooth wavy elastomer substrate of U.S. Pat. No. 8,217,381 and a schematic structural view of each step of the method for fabricating a smooth wavy elastomer substrate of U.S. Pat. No. 8,217,381. As shown in figures, Anisotropic Si 100 etching provides a substrate 20 having sharp-edges 24, as shown in FIG. 8B. Spin PR smoothes the sharp-edged valleys by depositing PR 26 in the sharp-edged valleys 24 of substrate 20. An elastomeric stamp 34 is cast against substrate 20. Stamp 34 has sharpedged recess features. A second elastomeric stamp 36 is cast on stamp 34 to generate a stamp having sharp-edged peaks. Stamp 36 is embossed with Su-8 50 and cured as appropriate. Spin PR 26 smoothes the sharp-edged valleys of 50. Elastomeric substrate 30 is cast against the 50 having smooth valleys. Substrate 30 is removed to reveal a wavy and smooth surface 32. Further, the independent claim of U.S. Pat. No. 8,217,381 is as below:

A two-dimensional stretchable and bendable device comprising: an elastomeric substrate having a contact surface; an interconnect having a first end bonded to said elastomeric substrate contact surface and a second end bonded to said elastomeric substrate contact surface, and a central portion between said first and second ends; wherein movement of said first end and said second ends toward each other generates a curve and physical separation between said elastomeric substrate contact surface and interconnect central portion with a maximum physical separation distance between said central portion and said elastomeric substrate contact surface that is greater than or equal to 100 nm and less than or equal to 1 mm; said first end connected to a first contact pad and said second end connected to a second contact pad, wherein said contact pads are substantially flat for receiving a device component and said contact pads are bonded to said substrate; wherein said interconnect electrically connects said first contact pad and said second contact pad, and said curved central portion provides said device stretching and bending while maintaining electrical connectivity when said contact pads move relative to one another.

For the aspect of functions of U.S. Pat. No. 8,217,381, it discloses how a smooth wavy elastomer substrate and a two-dimensional stretchable and bendable device are fabricated. It is not enough to develop a thin film fabrication of a rubber material with piezoelectric characteristics through utilizing polymer casting, multilayer stacking, surface coating, and micro plasma discharge processes. Hence to design the thin film fabrication of the rubber material with the piezoelectric characteristics is an important issue for the people skilled in the art.

SUMMARY OF THE INVENTION

The main object of the present invention is provide a thin film fabrication of a rubber material with piezoelectric characteristics and a manufacturing method thereof. The present invention is developed by utilizing polymer casting, multilayer stacking, surface coating, and micro plasma discharge processes. To realize the desired electromechanical sensitivity, cellular PDMS structures with micrometer-sized voids are implanted with bipolar charges on the opposite inner surfaces. The implanted charge pairs function as dipoles, which respond promptly to diverse electromechanical simulation.

The film fabrication of the rubber material with the piezoelectric characteristics at least comprises: a first electrode layer, having a lower surface; a first PDMS (polydimethylsiloxane) solid layer, having an upper surface and a lower surface, the upper surface of the first PDMS solid layer is corresponding to the lower surface of the first electrode layer; a first PDMS void layer, having an upper surface and a lower surface, the upper surface of the first PDMS void layer is corresponding to the lower surface of the first PDMS solid layer; a bottom PDMS solid layer, having an upper surface and a lower surface, the upper surface of the bottom PDMS solid layer is corresponding to the lower surface of the second PDMS void layer; and a second electrode layer, having an upper surface, the upper surface of the second electrode layer is corresponding to the lower surface of the bottom PDMS solid layer.

The method for manufacturing the film fabrication of the rubber material with the piezoelectric characteristics comprises the steps of: (1) making a first mold, and utilizing curing and stripping procedures to form a first PDMS solid layer and a first PDMS void layer, the first PDMS solid layer having an upper surface and a lower surface, the first PDMS void layer having an upper surface and a lower surface, the upper surface of the first PDMS void layer being corresponding to the lower surface of the first PDMS solid layer; (2) providing a bottom PDMS solid layer, which has an upper surface and a lower surface, the upper surface of the bottom PDMS solid layer being corresponding to the lower surface of the first PDMS void layer; and (3) providing a first electrode layer and a second electrode layer, the first electrode layer having a lower surface, the second electrode layer having an upper surface, the lower surface of the first electrode layer being corresponding to the upper surface of the first PDMS solid layer, the upper surface of the second electrode layer being corresponding to the lower surface of the bottom PDMS solid layer.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein:

FIG. 5A illustrates a schematic view of a plural of isolated inner voids of a casting micro multi-layer structure of the film fabrication of the rubber material with the piezoelectric characteristics of the present invention;

FIG. 5B illustrates a schematic view of a plural of inner channels of the casting micro multi-layer structure of the film fabrication of the rubber material with the piezoelectric characteristics of the present invention;

FIG. 5C illustrates a schematic view of the inner voids connected to each other as checkerboard of the casting micro multi-layer structure of the film fabrication of the rubber material with the piezoelectric characteristics of the present invention;

FIG. 6A and FIG. 6B illustrate a schematic view of a principle of the film fabrication of the rubber material with piezoelectric characteristics of the present invention, wherein FIG. 6A shows a ferroelectrest structure, and FIG. 6B shows that producing piezoelectric characteristics after force-to-deformation;

DETAILED DESCRIPTION OF THE INVENTION

Following preferred embodiments and figures will be described in detail so as to achieve aforesaid objects.

The present invention is related to a thin film fabrication of a rubber material with piezoelectric characteristics and a manufacturing method thereof. The present invention is developed by utilizing high polymer casting, polymer casting, multilayer stacking, surface coating, and micro plasma discharge processes. To realize the desired electromechanical sensitivity, cellular PDMS structures with micrometer-sized voids are implanted with bipolar charges on the opposite inner surfaces. The implanted charge pairs function as dipoles, which respond promptly to diverse electromechanical simulation. In the prototype demonstration, cellular PDMS films with various void geometries are fabricated and internally coated with a thin layer of polytetrafluoroethylene (PTFE), which can secure the implanted charges. An electric field up to 27 MV/m is applied across the fabricated PDMS films to ionize the air in the voids and to accelerate the resulting bipolar charges to bombard the opposite inner surfaces. The resulting charge-implanted, cellular PDMS films as cellular rubber material films show a low effective elastic modulus (E) of about 500 kPa, and a piezoelectric coefficient (d33) higher than 1000 pC/N, which is more than thirty times higher than those of common piezoelectric polymers (e.g. polyvinylidene fluoride, PVDF). Furthermore, the piezoelectricity of the PDMS films as cellular rubber material films can be tailored by adjusting the dimensions of the cellular structures. As such, the demonstrated piezoelectric PDMS films as cellular rubber material films could potentially serve as flexible and sensitive electromechanical materials, and fulfill the needs of a variety of sensor, actuator, biometric monitoring, and energy harvesting applications.

Figure 6A:
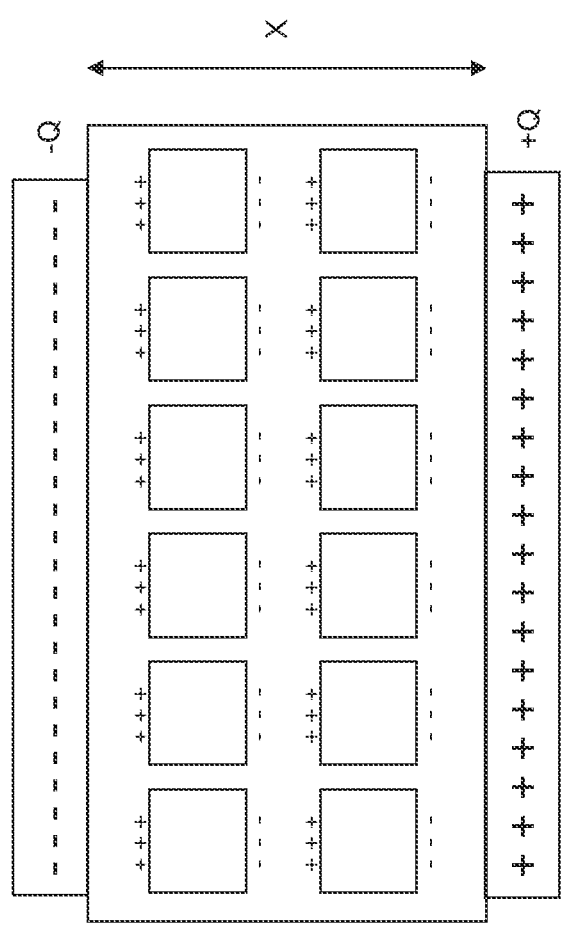
Figure 6B:
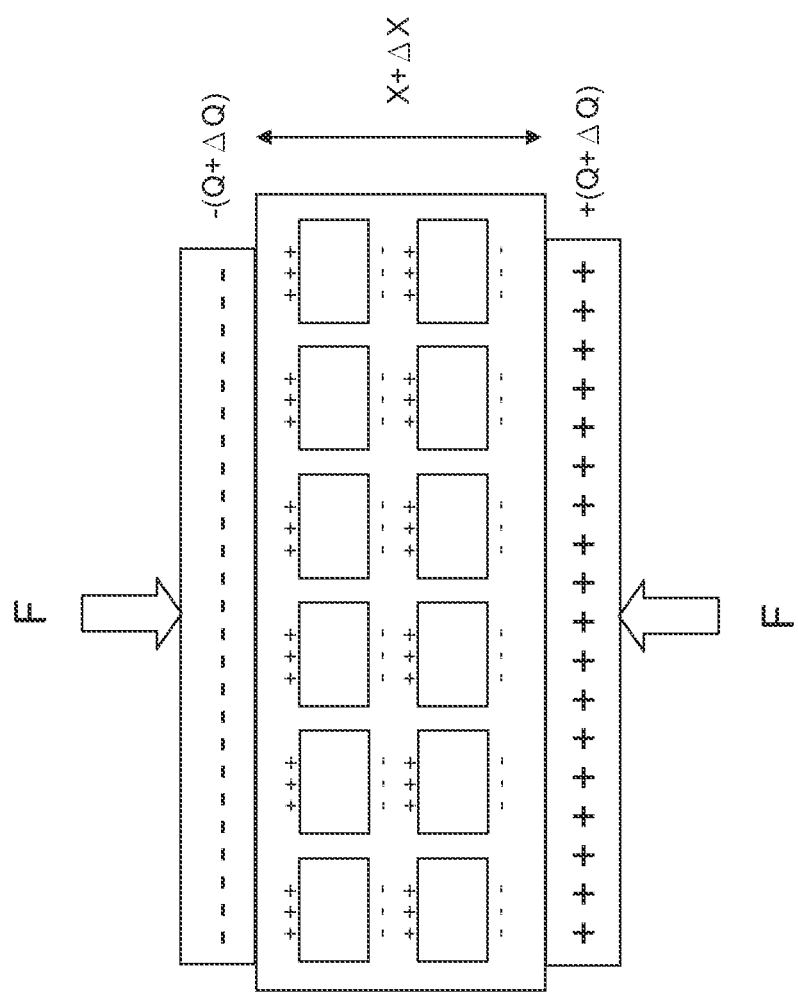

With references to FIG. 6A and FIG. 6B, which illustrate a schematic view of a principle of the film fabrication of the rubber material with piezoelectric characteristics of the present invention, wherein FIG. 6A shows a ferroelectrest structure, and FIG. 6B shows that producing piezoelectric characteristics after force-to-deformation. The implanted charge pairs function as dipoles, which respond promptly to diverse electromechanical stimulation. The implantation of bipolar charges on the void surfaces is realized by placing cellular PDMS films in strong electric fields, which eventually cause the air inside the voids to break down. In this work, the implantation is performed between pairs of parallel-plate electrodes. The breakdown criteria for this type of configuration can usually be predicted by Paschen's law, which fails, however, for tiny gaps of micrometer size. For micrometer-sized voids, generally the required breakdown fields are higher than those predicated by Paschen's law. Once the breakdown threshold is exceeded, micro plasma discharges are generated inside the voids and then self-extinguished because of the deposition of bipolar charges on the opposite inner surfaces. The charge implanted, cellular PDMS structures as cellular rubber material films are flexible and highly polarized. Upon the application of electromechanical stresses, the quasi-dipoles inside the PDMS structures change their moments, which results in the desired piezoelectricity. As also illustrated in FIG. 6B, the application of a force to a charge-implanted cellular PDMS film is expected to change the thickness of the film, and therefore the induced charge density on the top and bottom electrodes as well.

Figure 7:
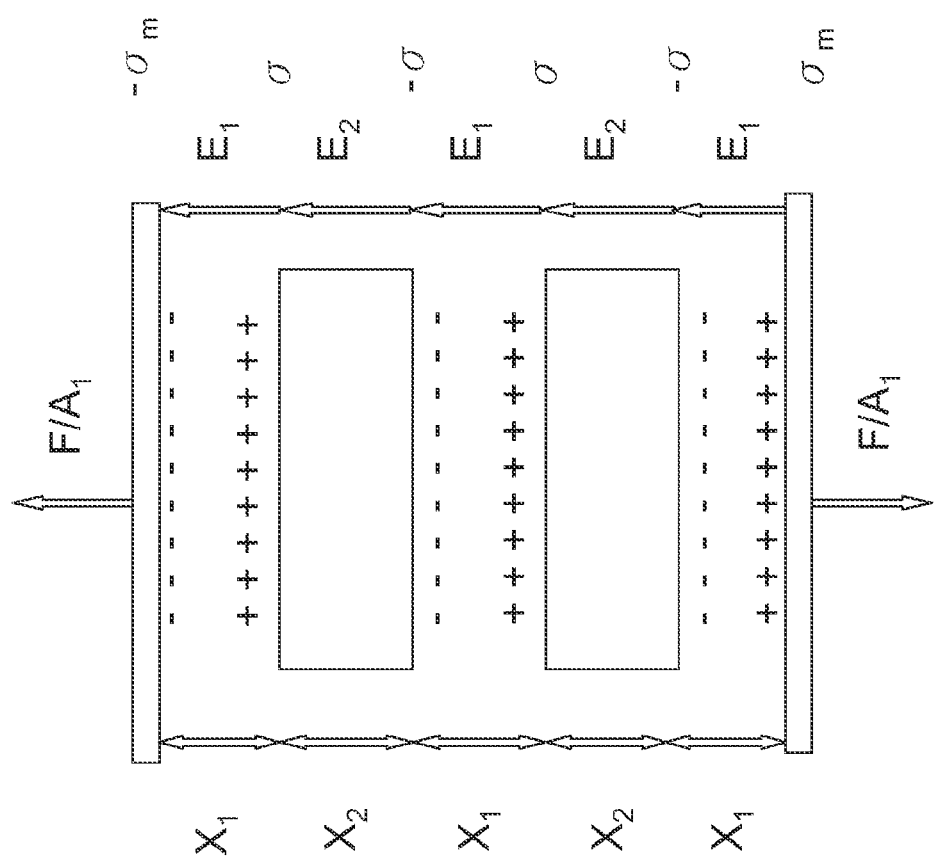
FIG. 7 illustrates a schematic view of a simplified model of the film fabrication of the rubber material with piezoelectric characteristics of the present invention.
Figures 8A, 8B:
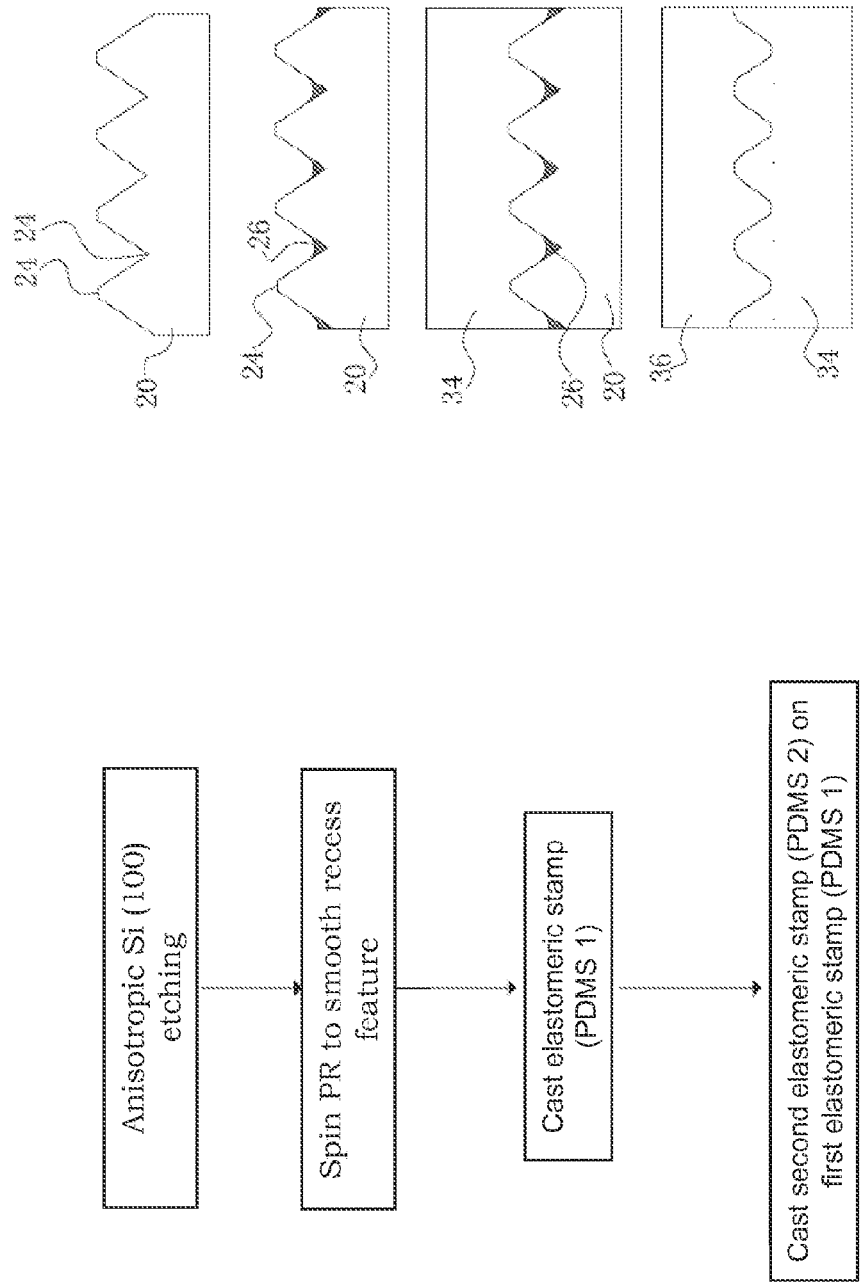
FIG. 8A and FIG. 8C illustrate a schematic view of a method for fabricating a smooth wavy elastomer substrate of U.S. Pat. No. 8,217,381.
FIG. 8B and FIG. 8D illustrate a schematic structural view of each step of the method for fabricating a smooth wavy elastomer substrate of U.S. Pat. No. 8,217,381.
Figures 8C, 8D:
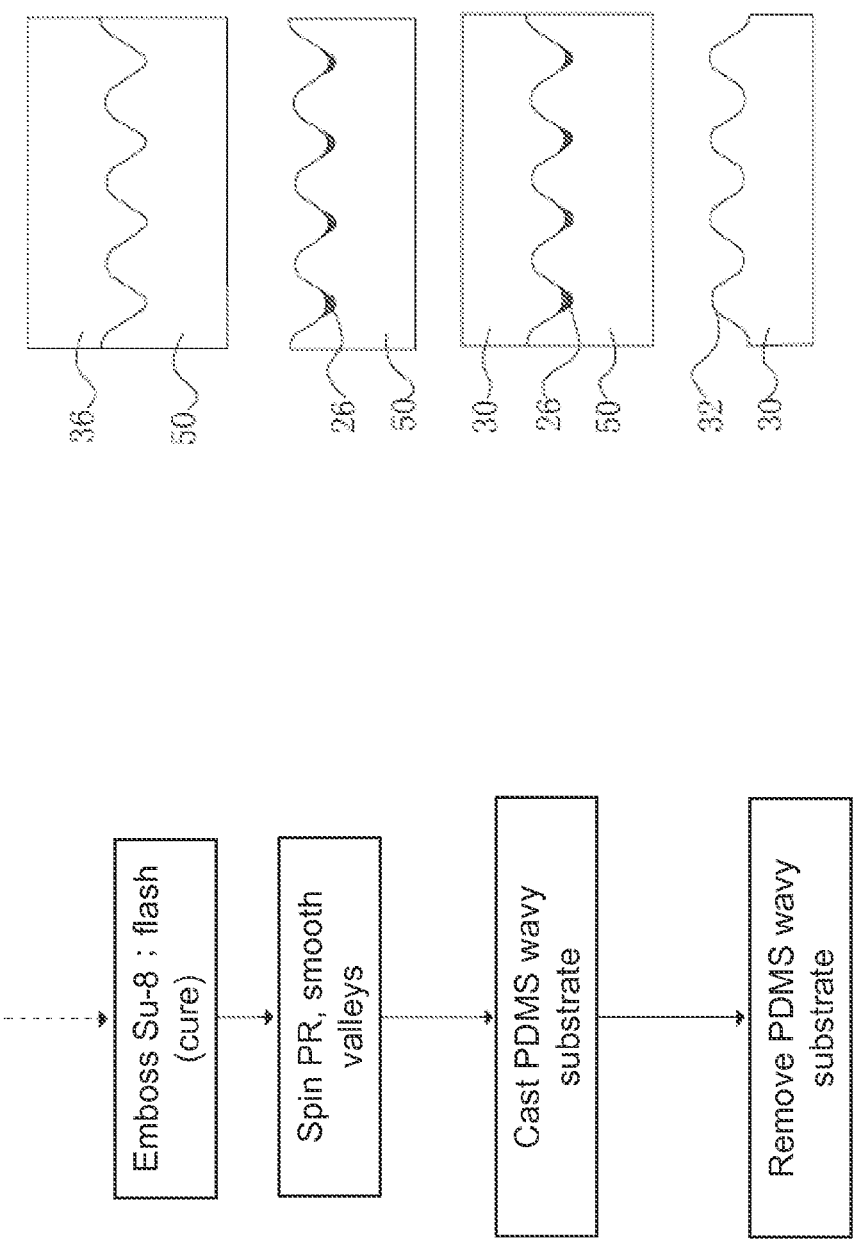

With reference to FIG. 7, which illustrates a schematic view of a simplified model of the film fabrication of the rubber material with piezoelectric characteristics of the present invention. The structure is composed of top and bottom electrodes, and alternating solid and void layers in between. For a structure with n void layers and n+1 solid layers, the electric field in the solid layers (E1) and void layers (E2) can be obtained from Gauss' law for the interfaces.

Figure 1:
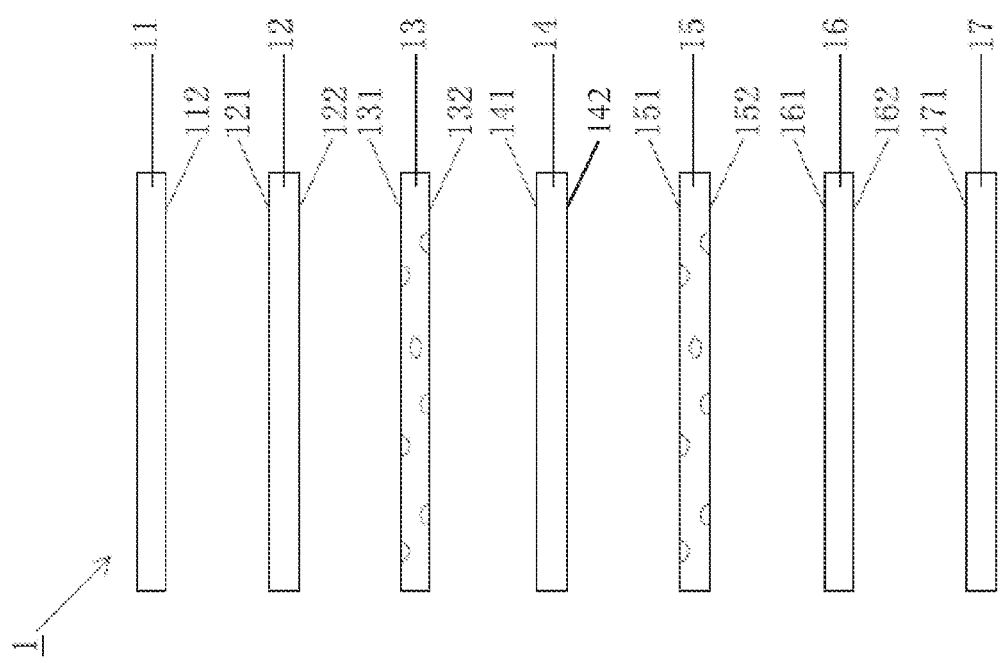
FIG. 1 illustrates a schematic view of a schematic exploded view of a preferred embodiment of the film fabrication of the rubber material with piezoelectric characteristics of the present invention.

With reference to FIG. 1, which illustrates a schematic exploded view of a preferred embodiment of the film fabrication of the rubber material with piezoelectric characteristics of the present invention. The film fabrication 1 of the rubber material with piezoelectric characteristics includes:
a first electrode layer 11, which has a lower surface 112;
a first PDMS (polydimethylsiloxane) solid layer, which has an upper surface 121 and a lower surface 122, the upper surface 121 of the first PDMS solid layer 12 is corresponding to the lower surface 112 of the first electrode layer 11;
a first PDMS void layer 13, which has an upper surface 131 and a lower surface 132, the upper surface 131 of the first PDMS void layer 13 is corresponding to the lower surface 122 of the first PDMS solid layer 12;
a second PDMS solid layer 14, which has an upper surface 141 and a lower surface 142, the upper surface 141 of the second PDMS solid layer 14 is corresponding to the lower surface 132 of the first PDMS void layer 13;
a second PDMS void layer 15, which has an upper surface 151 and a lower surface 152, the upper surface 151 of the second PDMS void layer 15 is corresponding to the lower surface 142 of the second PDMS solid layer 14;
a bottom PDMS solid layer 16, which has an upper surface 161 and a lower surface 162, the upper surface 161 of the bottom PDMS solid layer 16 is corresponding to the lower surface 152 of the second PDMS void layer 15; and
a second electrode layer 17, which has an upper surface 171, the upper surface 171 of the second electrode layer 17 is corresponding to the lower surface 162 of the bottom PDMS solid layer 16.

Figure 2:
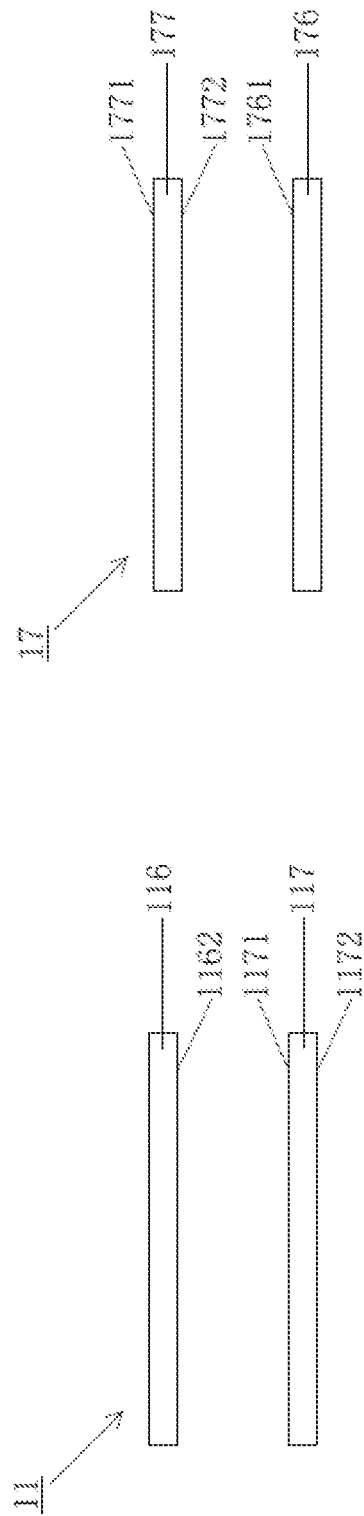
FIG. 2A illustrates a schematic exploded view of the first electrode layer of the preferred embodiment of the film fabrication of the rubber material with piezoelectric characteristics of the present invention.
FIG. 2B illustrates a schematic exploded view of the second electrode layer of the preferred embodiment of the film fabrication of the rubber material with piezoelectric characteristics of the present invention.

With references to FIG. 2A and FIG. 2B, which illustrate a schematic exploded view of the first electrode layer of the preferred embodiment of the film fabrication of the rubber material with piezoelectric characteristics of the present invention and a schematic exploded view of the second electrode layer of the preferred embodiment of the film fabrication of the rubber material with piezoelectric characteristics of the present invention. As shown in FIG. 2A, the first electrode layer 11 includes: a first elastic gold film 116, which has a lower surface 1162; and a first MPTMS (3-mercaptopropyltrimethoxysilane) adhering layer 117, which has an upper surface 1171 and a lower surface 1172, the lower surface 1162 of the first elastic gold film 116 is corresponding to the upper surface 1171 of the first MPTMS adhering layer 117, wherein the lower surface 1172 of the first MPTMS adhering layer 117 and the lower surface 112 of the first electrode layer 11 are the same surface. As shown in FIG. 2B, the second electrode layer 17 includes: a second MPTMS adhering layer 177, which has an upper surface 1771 and a lower surface 1772; and a second elastic gold film 176, which has an upper surface 1761, the lower surface 1772 of the second MPTMS adhering layer 177 is corresponding to the upper surface 1761 of the second elastic gold film 176, wherein the upper surface 1771 of the second MPTMS adhering layer 177 and the upper surface 1761 of the second electrode layer 17 are the same surface.

Figure 3:
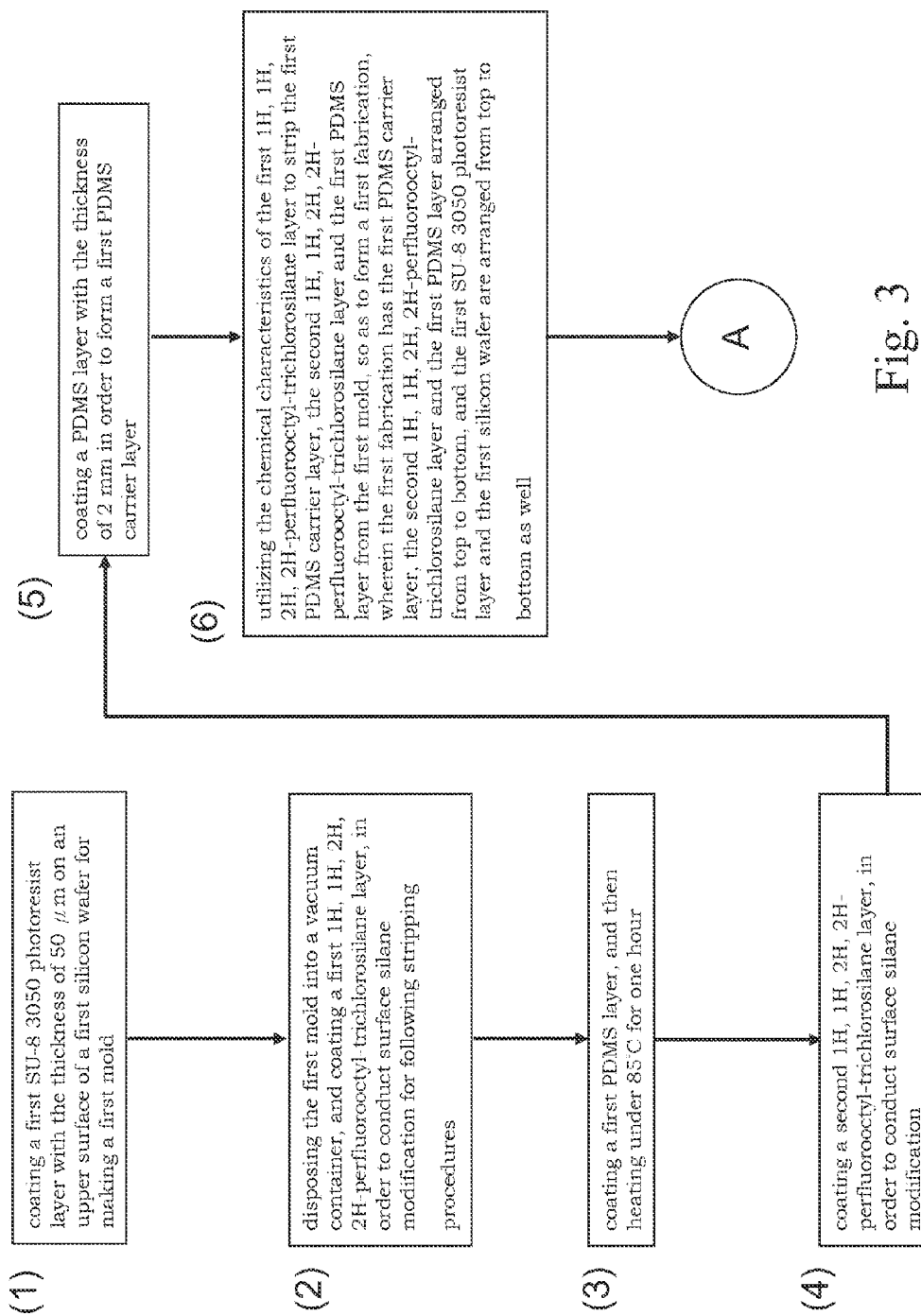
FIG. 3 illustrates a flow chart of the method for manufacturing the film fabrication of the rubber material with piezoelectric characteristics of the present invention.
Figure 3:
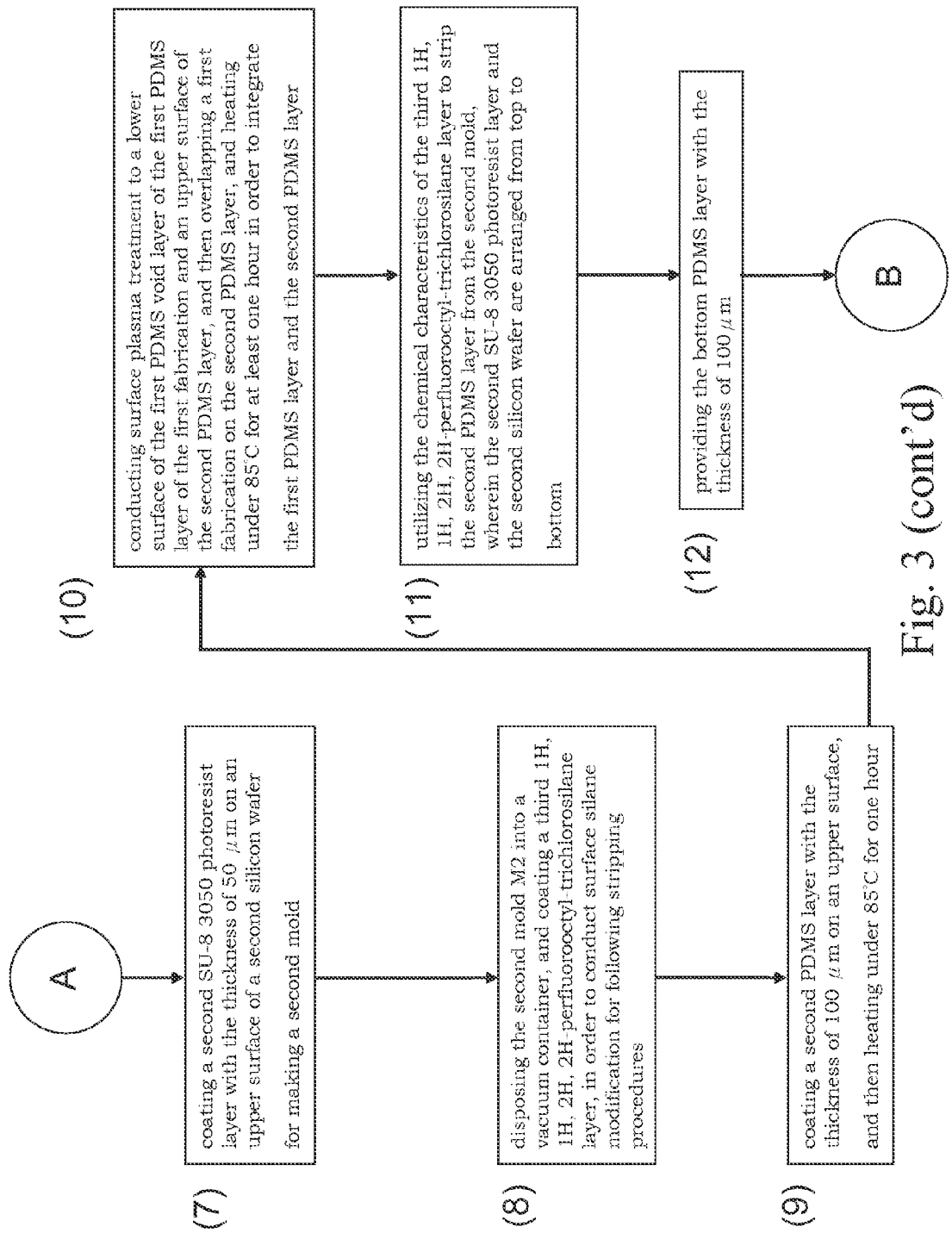
Figure 3:
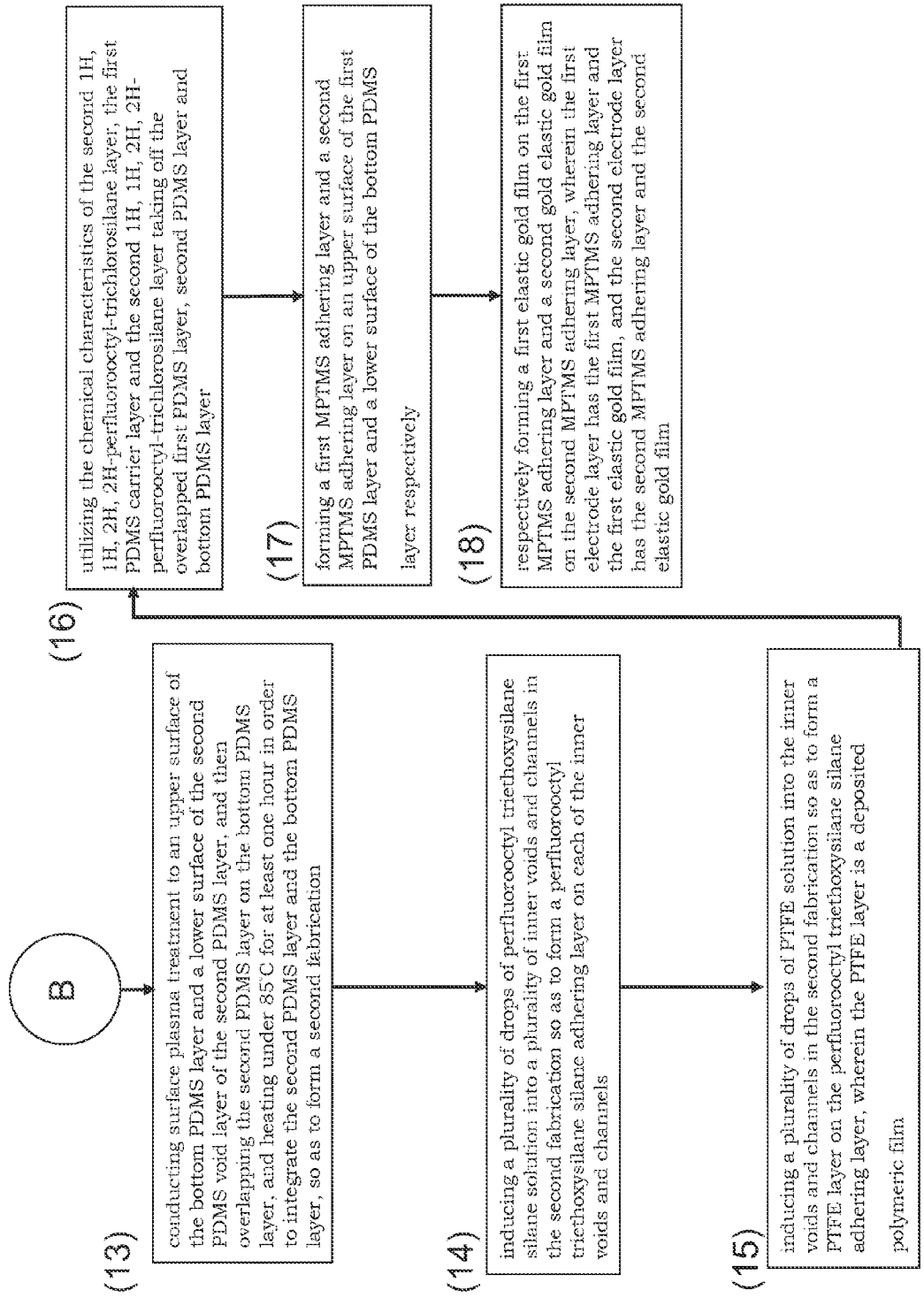
Figure 4B:
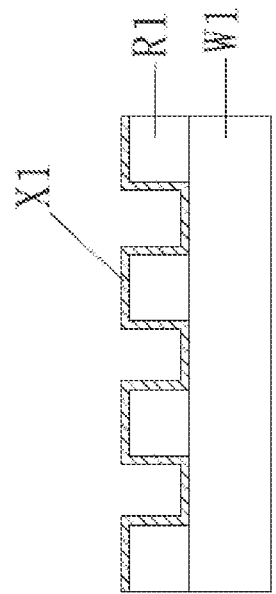
FIG. 4A to FIG. 4R illustrate a schematic view of a fabrication corresponding to a step of the method for manufacturing the film fabrication of the rubber material with piezoelectric characteristics of the present invention.
Figure 4A:
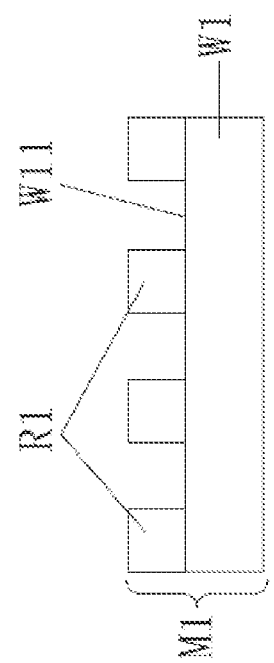
Figure 4D:
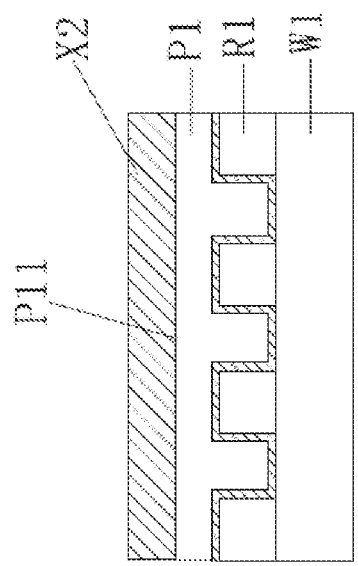
Figure 4C:
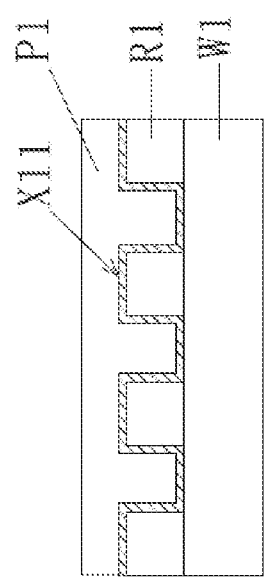
Figure 4F:
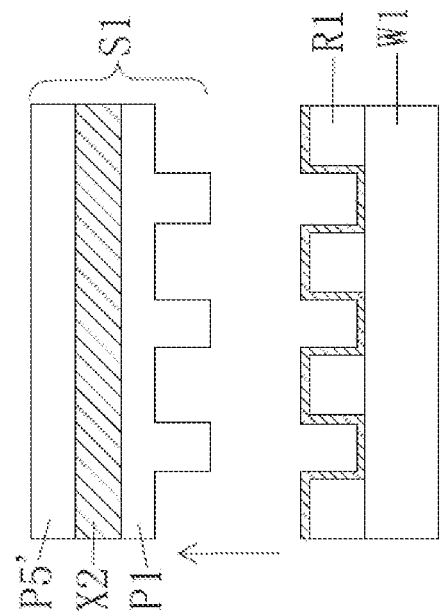
Figure 4E:
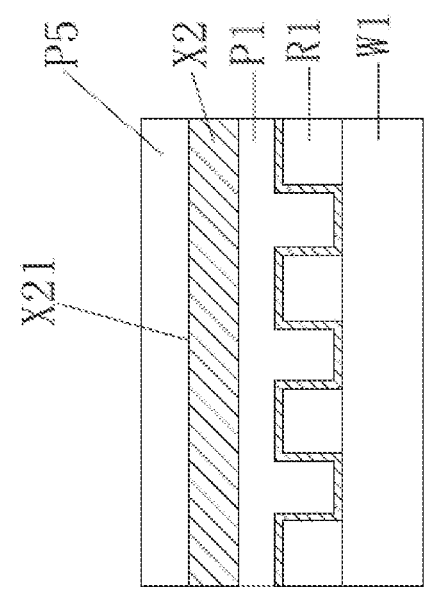
Figure 4H:
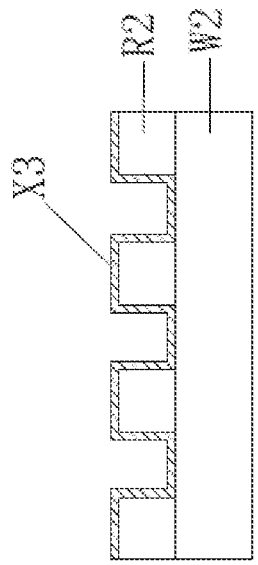
Figure 4G:
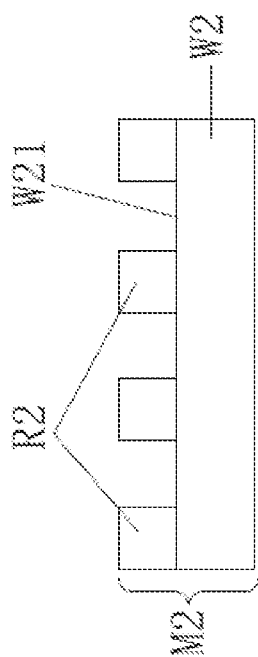
Figure 4J:
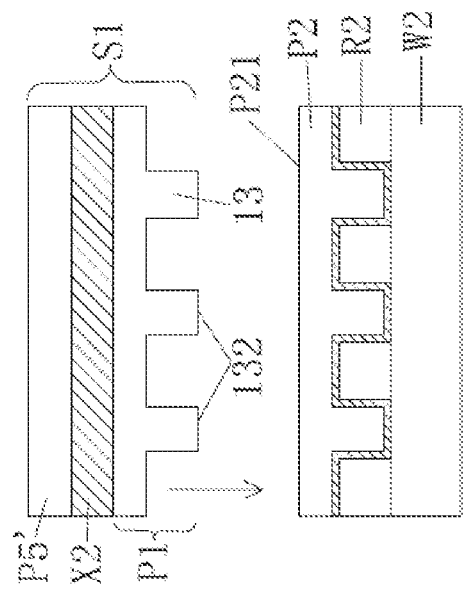
Figure 4I:
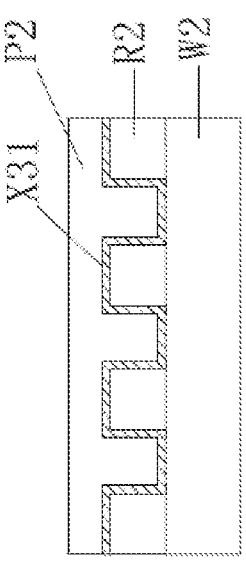
Figure 4L:
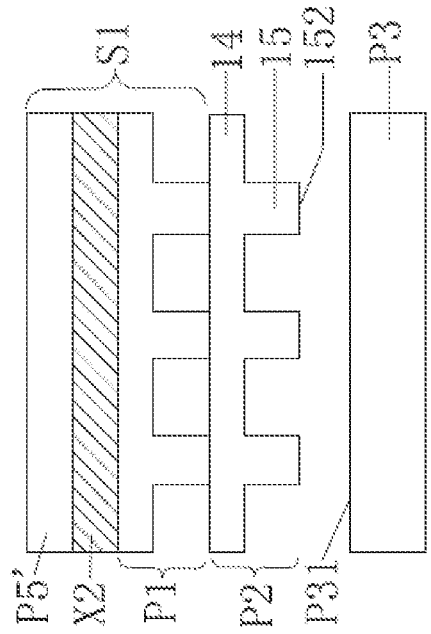
Figure 4K:
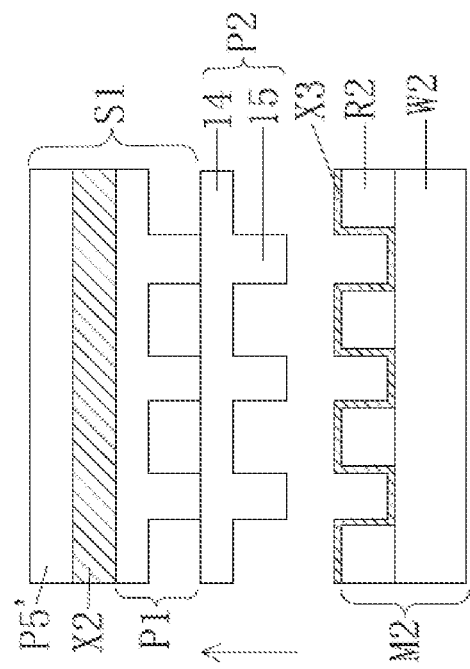
Figure 4N:
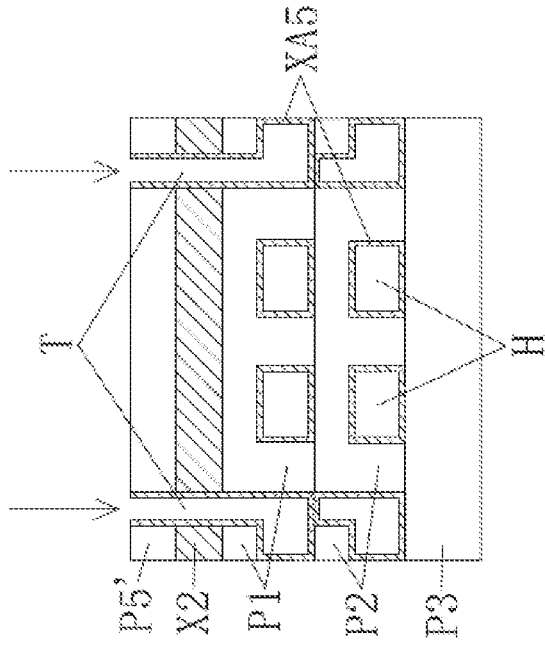
Figure 4M:
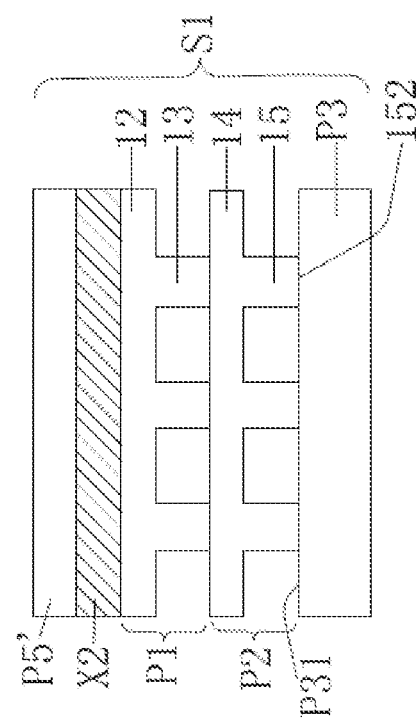
Figure 4R:
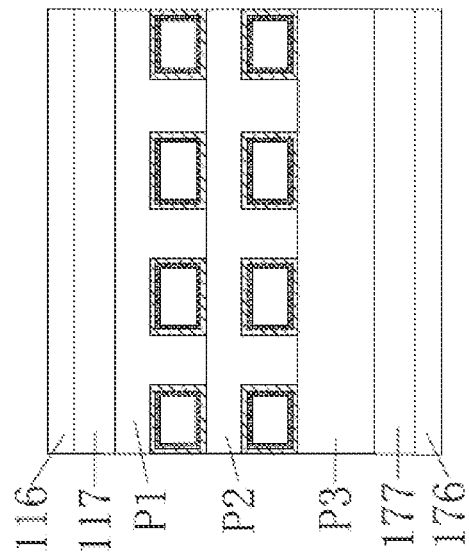
Figure 4Q:
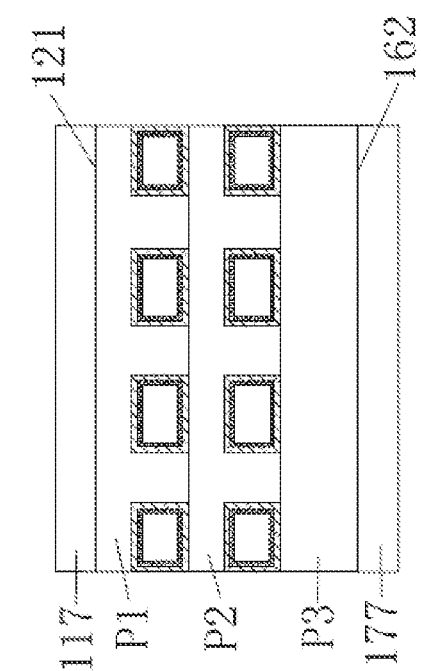

With references to FIG. 3 and FIG. 4A to FIG. 4R, which illustrates a flow chart of the method for manufacturing the film fabrication of the rubber material with piezoelectric characteristics of the present invention and a schematic view of a fabrication corresponding to a step of the method for manufacturing the film fabrication of the rubber material with piezoelectric characteristics of the present invention. As shown in figures, the method includes the steps of:

(1) coating a first SU-8 3050 photoresist layer R1 with the thickness of 50 μm on an upper surface W11 of a first silicon wafer W1 according to a graph in order to define the graph (the parts with indentations and convexes in figures representing graph) on the upper surface W11 of the first silicon wafer W1 for making a first mold M1, as shown in FIG. 4A;

(2) disposing the first mold M1 into a vacuum container (not shown in figure), and coating a first 1H, 1H, 2H, 2H-perfluorooctyl-trichlorosilane layer X1 on the upper surfaces W11 of the first SU-8 3050 photoresist layer R1 and the first silicon wafer W1, in order to conduct surface silane modification for the conveniences of following stripping procedures, as shown in FIG. 4B;

(3) coating a first PDMS layer P1 with the thickness of 100 μm on an upper surface X11 of the first 1H, 1H, 2H, 2H-perfluorooctyl-trichlorosilane layer X1, and then heating under 85° C. for one hour, as shown in FIG. 4C;

(4) coating a second 1H, 1H, 2H, 2H-perfluorooctyl-trichlorosilane layer X2 on an upper surface P11 of the cured first PDMS layer P1, in order to conduct surface silane modification, as shown in FIG. 4D;

(5) coating a PDMS layer P5 with the thickness of 2 mm on an upper surface X21 of the second 1H, 1H, 2H, 2H-perfluorooctyl-trichlorosilane layer X2 in order to form a first PDMS carrier layer P5', as shown in FIG. 4E;

(6) utilizing the chemical characteristics of the first 1H, 1H, 2H, 2H-perfluorooctyl-trichlorosilane layer X1 to strip the first PDMS carrier layer P5', the second 1H, 1H, 2H, 2H-perfluorooctyl-trichlorosilane layer X2 and the first PDMS layer P1 having the first PDMS solid layer 12 and the first PDMS void layer 13 from the first mold M1 having the first SU-8 3050 photoresist layer R1 and the first silicon wafer W1, so as to form a first fabrication S1, wherein the first fabrication S1 has the first PDMS carrier layer P5', the second 1H, 1H, 2H, 2H-perfluorooctyl-trichlorosilane layer X2 and the first PDMS layer P1 arranged from top to bottom, and the first SU-8 3050 photoresist layer R1 and the first silicon wafer W1 are arranged from top to bottom as well, as shown in FIG. 4F;

(7) coating a second SU-8 3050 photoresist layer R2 with the thickness of 50 μm on an upper surface W21 of a second silicon wafer W2 according to a graph in order to define the graph (the parts with indentations and convexes in figures representing graph) on the upper surface W21 of the second silicon wafer W2 for making a second mold M2, as shown in FIG. 4G;

(8) disposing the second mold M2 into a vacuum container (not shown in figure), and coating a third 1H, 1H, 2H, 2H-perfluorooctyl-trichlorosilane layer X3 on the upper surfaces W21 of the second SU-8 3050 photoresist layer R2 and the second silicon wafer W2, in order to conduct surface silane modification for the conveniences of the following stripping procedures, as shown in FIG. 4H;

(9) coating a second PDMS layer P2 with the thickness of 100 μm on an upper surface X31 of the third 1H, 1H, 2H, 2H-perfluorooctyl-trichlorosilane layer X3, and then heating under 85° C. for one hour, as shown in FIG. 4I;

(10) conducting surface plasma treatment to a lower surface 132 of the first PDMS void layer 13 of the first PDMS layer P1 of the first fabrication S1 and an upper surface P21 of the second PDMS layer P2, and then overlapping a first fabrication S1 having the first PDMS carrier layer P5', the second 1H, 1H, 2H, 2H-perfluorooctyl-trichlorosilane layer X2 and the first PDMS layer P1 on the second PDMS layer P2, and heating under 85° C. for at least one hour in order to integrate the first PDMS layer P1 and the second PDMS layer P2, as shown in FIG. 4J;

(11) utilizing the chemical characteristics of the third 1H, 1H, 2H, 2H-perfluorooctyl-trichlorosilane layer X3 to strip the second PDMS layer P2 having the second PDMS solid layer 14 and the second PDMS void layer 15 from the second mold M2 having the second SU-8 3050 photoresist layer R2 and the second silicon wafer W2, wherein the second SU-8 3050 photoresist layer R2 and the second silicon wafer W2 are arranged from top to bottom, as shown in FIG. 4K;

(12) providing the bottom PDMS layer P3 with the thickness of 100 μm, as shown in FIG. 4L;

(13) conducting surface plasma treatment to an upper surface P31 of the bottom PDMS layer P3 and a lower surface 152 of the second PDMS void layer 15 of the second PDMS layer P2, and then overlapping the second PDMS layer P2 on the bottom PDMS layer P3, and heating under 85° C. for at least one hour in order to integrate the second PDMS layer P2 and the bottom PDMS layer P3, so as to form a second fabrication having the first PDMS carrier layer P5', the second 1H, 1H, 2H, 2H-perfluorooctyl-trichlorosilane layer X2, the first PDMS layer P1, the second PDMS layer P2, and the bottom PDMS layer P3 arranged from top to bottom, wherein the first PDMS layer P1 has the first PDMS solid layer 12 and the first PDMS void layer 13, and the second PDMS layer P2 has the second PDMS solid layer 14 and the second PDMS void layer 15, as shown in FIG. 4M;

(14) inducing a plurality of drops of perfluorooctyl triethoxysilane silane solution into a plurality of inner voids H and channels T in the second fabrication S2 so as to form a perfluorooctyl triethoxysilane silane adhering layer XA5 on each of the inner voids H and channels T, as shown in FIG. 4N;

(15) inducing a plurality of drops of PTFE (polytetra-fluoro-ethylene) solution into the inner voids H and channels T in the second fabrication S2 so as to form a PTFE layer PT on the perfluorooctyl triethoxysilane silane adhering layer XA5, wherein PTFE is a polymeric material, and therefore the PTFE layer is a deposited polymeric film, as shown in FIG. 4O;

(16) utilizing the chemical characteristics of the second 1H, 1H, 2H, 2H-perfluorooctyl-trichlorosilane layer X2, the first PDMS carrier layer P5' and the second 1H, 1H, 2H, 2H-perfluorooctyl-trichlorosilane layer X2 taking off the overlapped first PDMS layer P1, second PDMS layer P2 and bottom PDMS layer P3, since the bonding strength between the surfaces of the PDMS layers is stronger than the bonding strength between the surfaces that are conducted by surface silane modification, as shown in FIG. 4P;

(17) forming a first MPTMS adhering layer 117 and a second MPTMS adhering layer 177 on an upper surface 121 of the first PDMS layer P1 and a lower surface 162 of the bottom PDMS layer P3 respectively, as shown in FIG. 4Q;

(18) respectively forming a first elastic gold film 116 on the first MPTMS adhering layer 117 and a second gold elastic gold film 176 on the second MPTMS adhering layer 177, wherein the first electrode layer 11 has the first MPTMS adhering layer 117 and the first elastic gold film 116, and the second electrode layer 17 has the second MPTMS adhering layer 177 and the second elastic gold film 176, an upper surface 1171 of the first MPTMS adhering layer 117 being corresponding to a lower surface 1162 of the first elastic gold film 116, a lower surface 1772 of the second MPTMS adhering layer 177 being corresponding to an upper surface 1761 of the second elastic gold film 176, as shown in FIG. 4R.

With references to FIG. 5A to FIG. 5C, which illustrate a schematic view of a plural of isolated inner voids of a casting micro multi-layer structure of the film fabrication of the rubber material with the piezoelectric characteristics of the present invention, a schematic view of a plural of inner channels of the casting micro multi-layer structure of the film fabrication of the rubber material with the piezoelectric characteristics of the present invention and a schematic view of the inner voids connected to each other as checkerboard of the casting micro multi-layer structure of the film fabrication of the rubber material with the piezoelectric characteristics of the present invention, wherein the voids disclosed in FIG. 5B and FIG. 5C and connected to each other are opened to communicate with atmosphere so as to conduct surface coating procedures, and FIG. 5C shows a plurality of columnar PDMS's, further, FIG. 5A and FIG. 5C are the relationship of positive and negative films for the definition of mask so as to let the independent voids in FIG. 5A become the columnar PDMS's in FIG. 5C after turning mode/duplication. As the surface plasma treatment in step (10), the surfaces of the two PDMS layers are treated with a hand-held corona treater (BD-20AC, Electro-Technic Products), which ionizes surrounding air and creates localized plasma to activate the surfaces for irreversible bonding. The intensity of the corona is set at a relatively low level in order to produce a stable but soft corona with minimal crackling and sparking. The wire electrode is positioned approximately 3 mm above the treated surface, and scanned back and forth for 30 sec to 1 min, depending on the size of the surface. The corona-treated surfaces are then pressed together and left undisturbed for at least 1 hour at 85° C. for irreversible bonding to take effect. In this work, stacks of two void layers and three solid layers are fabricated. The overall thickness of the assembled PDMS structures is about 300 μm and the films have an area of 3 cm×3 cm. As illustrated in FIG. 5A, the size of the inner voids is 50×50×50 μm$^3$, and the distance between voids is also 50 μm. In addition to isolated-void structures, connected-void structures are fabricated and characterized in our trials as well. FIG. 5B illustrates the geometry of the connected-void structures, in which all the voids are connected with channels of 20 μm width and 50 μm height. With this connected geometry, surface modification and coating of the voids can further be realized. According to FIG. 5C, it is a present structure. The connected-void is figured as checkerboard with channels of 50 μm width and 50 μm height, and the rubber material structure with 50 μm width, 50 μm height and 50 μm length is shaped as pillar structure for supporting the overall film structure. To be the same with FIG. 5A and FIG. 5B, the sizes of the inner void and the distance between voids are 50×50×50 μm$^3$ and 50 μm respectively, as shown in FIG. 5C. It is expected that the deposition of an extra semi-crystalline polymer, which is capable of storing charges stably, can improve the piezoelectricity of the fabricated cellular PDMS structures as cellular rubber material. The connected voids are then filled with PTFE solution (Teflon, DuPont), which deposits a thin layer of semi-crystalline polymer once the solvent evaporates, as illustrated in FIG. 4N and FIG. 4O. Afterward, the PDMS films are coated with electrodes on their top and bottom surfaces, as illustrated in FIG. 4Q and FIG. 4R, and implanted internally with charges under strong electric fields. In our trials, an implantation voltage up to about 8 kV, which corresponds to an electric field of 27 MV/m, is employed to ionize the air within the voids. Once the required breakdown field is reached, a self-extinguishing micro discharge is ignited in each void, accompanied by the emission of a short light pulse and by the transfer of charges across the void. Charges are accelerated and implanted onto the surface of each void. In our trials, triangular voltage waves with amplitudes between 7.5 and 11.5 kV and frequencies of less than 0.5 Hz are applied across the electrodes to charge the PDMS films as rubber material film for 15 min. Meanwhile, the charged PDMS films are heated up to 100° C. throughout the micro plasma discharge process. Once internally charged, the cellular PDMS films as cellular rubber material films function as flexible and sensitive piezoelectric materials that can be used to interconvert signals between acoustical and electrical or mechanical and electrical sources.

The present invention presents a controlled polymer casting, multilayer stacking, surface coating and micro plasma discharge process-flow that can readily produce piezoelectric rubber material films with desired cellular structures and electromechanical properties. Both rubber material and the demonstrated fabrication processes are MEMS compatible, which greatly facilitates the integration of the presented piezoelectric films with common microsystems. Cellular rubber material films show a low effective elastic modulus (E) of about 500 kPa, and a piezoelectric coefficient (d33) higher than 1000 pC/N, which is more than three times higher than those of general piezoelectric ceramics and thirty times higher than those of common piezoelectric polymers, such as polyvinylidene fluoride (PVDF). By utilizing the low elastic modulus of cellular rubber material film structures and the high charge density of polytetrafluoroethylene (PTFE) films, high piezoelectricity is demonstrated. Furthermore, the piezoelectricity of the rubber material films can be tailored by adjusting the dimensions of the inner voids. As such, the demonstrated piezoelectric rubber material films could potentially serve as flexible and sensitive electromechanical elements in microsystems, and fulfill the needs of a variety of sensor and energy harvesting applications.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims

What is claimed is:

1. A film fabrication of a rubber material with piezoelectric characteristics at least comprising:
    a first electrode layer, having a lower surface;
    a first PDMS (polydimethylsiloxane) solid layer, having an upper surface and a lower surface, the upper surface of the first PDMS solid layer being corresponding to the lower surface of the first electrode layer;
    a first PDMS void layer, having an upper surface and a lower surface, the upper surface of the first PDMS void layer being corresponding to the lower surface of the first PDMS solid layer;
    a bottom PDMS solid layer, having an upper surface and a lower surface, the upper surface of the bottom PDMS solid layer being corresponding to the lower surface of the second PDMS void layer; and
    a second electrode layer, having an upper surface, the upper surface of the second electrode layer being corresponding to the lower surface of the bottom PDMS solid layer.

2. The film fabrication of the rubber material with the piezoelectric characteristics according to claim 1 further comprising:
    a second PDMS solid layer, having an upper surface and a lower surface, the upper surface of the second PDMS solid layer being corresponding to the lower surface of the first PDMS void layer; and
    a second PDMS void layer, having an upper surface and a lower surface, the upper surface of the second PDMS void layer being corresponding to the lower surface of the second PDMS solid layer;
    wherein the lower surface of the second PDMS void layer is corresponding to the upper surface of the bottom PDMS solid layer.

3. The film fabrication of the rubber material with the piezoelectric characteristics according to claim 1, wherein the first electrode layer comprises:
    a first elastic gold film, which has a lower surface; and
    a first MPTMS (3-mercaptopropyltrimethoxysilane) adhering layer, which has an upper surface and a lower surface, the lower surface of the first elastic gold film being corresponding to the upper surface of the first MPTMS adhering layer.

4. The film fabrication of the rubber material with the piezoelectric characteristics according to claim 3, wherein the lower surface of the first MPTMS adhering layer and the lower surface of the first electrode layer are the same surface.

5. The film fabrication of the rubber material with the piezoelectric characteristics according to claim 1, wherein the second electrode layer comprises:
    a second MPTMS adhering layer, which has an upper surface and a lower surface; and
    a second elastic gold film, which has an upper surface, the lower surface of the second MPTMS adhering layer being corresponding to the upper surface of the second elastic gold film.

6. The film fabrication of the rubber material with the piezoelectric characteristics according to claim 5, wherein the upper surface of the second MPTMS adhering layer and the upper surface of the second electrode layer are the same surface.

7. A method for manufacturing a film fabrication of a rubber material with piezoelectric characteristics comprising the steps of:
    (1) making a first mold, and utilizing curing and stripping procedures to form a first PDMS solid layer and a first PDMS void layer, the first PDMS solid layer having an upper surface and a lower surface, the first PDMS void layer having an upper surface and a lower surface, the upper surface of the first PDMS void layer being corresponding to the lower surface of the first PDMS solid layer;
    (2) providing a bottom PDMS solid layer, which has an upper surface and a lower surface, the upper surface of the bottom PDMS solid layer being corresponding to the lower surface of the first PDMS void layer; and
    (3) providing a first electrode layer and a second electrode layer, the first electrode layer having a lower surface, the second electrode layer having an upper surface, the lower surface of the first electrode layer being corresponding to the upper surface of the first PDMS solid layer, the upper surface of the second electrode layer being corresponding to the lower surface of the bottom PDMS solid layer.

8. The method for manufacturing the film fabrication of the rubber material with the piezoelectric characteristics according to claim 7, wherein step (1) further comprises the steps of:
(11) coating a first SU-8 3050 photoresist layer with the thickness of 50 μm on an upper surface of a first silicon wafer according to a graph in order to define the graph on the upper surface of the first silicon wafer for making the first mold;
(12) disposing the first mold into a vacuum container, and coating a first 1H, 1H, 2H, 2H-perfluorooctyl-trichlorosilane layer on the upper surfaces of the first SU-8 3050 photoresist layer and the first silicon wafer, in order to conduct surface silane modification for the conveniences of the following stripping procedures;
(13) coating a first PDMS layer with the thickness of 100 μm on an upper surface of the first 1H, 1H, 2H, 2H-perfluorooctyl-trichlorosilane layer, and then heating under 85° C. for one hour;
(14) coating a second 1H, 1H, 2H, 2H-perfluorooctyl-trichlorosilane layer on an upper surface of the cured first PDMS layer, in order to conduct surface silane modification;
(15) coating a PDMS layer with the thickness of 2 mm on an upper surface of the second 1H, 1H, 2H, 2H-perfluorooctyl-trichlorosilane layer in order to form a first PDMS carrier layer; and
(16) utilizing the first 1H, 1H, 2H, 2H-perfluorooctyl-trichlorosilane layer to strip the first PDMS carrier layer, the second 1H, 1H, 2H, 2H-perfluorooctyl-trichlorosilane layer and the first PDMS layer having the first PDMS solid layer and the first PDMS void layer from the first mold having the first SU-8 3050 photoresist layer and the first silicon wafer, wherein the first PDMS carrier layer, the second 1H, 1H, 2H, 2H-perfluorooctyl-trichlorosilane layer and the first PDMS layer are arranged from top to bottom, and the first SU-8 3050 photoresist layer and the first silicon wafer are arranged from top to bottom as well.

9. The method for manufacturing the film fabrication of the rubber material with the piezoelectric characteristics according to claim 7, wherein a plurality of steps after step (1) are of:
(1A) making a second mold, and utilizing the curing procedures to form a second PDMS solid layer and a second PDMS void layer, the second PDMS solid layer having an upper surface and a lower surface, the second PDMS void layer having an upper surface and a lower surface, the upper surface of the second PDMS void layer being corresponding to the lower surface of the second PDMS solid layer, the second PDMS void layer still connecting with the second mold;
(1B) connecting the first PDMS solid layer and the first PDMS void layer with the second PDMS solid layer and the second PDMS void layer;
(1C) utilizing the stripping procedures to strip the second PDMS solid layer and the second PDMS void layer from the second mold; and
(1D) connecting the lower surface of the second PDMS void layer with the upper surface of the bottom PDMS solid layer.

10. The method for manufacturing the film fabrication of the rubber material with the piezoelectric characteristics according to claim 9, wherein step (1A) further comprises the steps of:
(1A1) coating a second SU-8 3050 photoresist layer with the thickness of 50 μm on an upper surface of a second silicon wafer according to a graph in order to define the graph on the upper surface of the second silicon wafer for making the second mold;
(1A2) disposing the second mold into a vacuum container, and coating a third 1H, 1H, 2H, 2H-perfluorooctyl-trichlorosilane layer on the upper surfaces of the second SU-8 3050 photoresist layer and the second silicon wafer, in order to conduct surface silane modification for the conveniences of the following stripping procedures; and
(1A3) coating a second PDMS layer with the thickness of 100 μm on an upper surface of the third 1H, 1H, 2H, 2H-perfluorooctyl-trichlorosilane layer, and then heating under 85° C. for one hour.

11. The method for manufacturing the film fabrication of the rubber material with the piezoelectric characteristics according to claim 9, wherein step (1B) further comprises the step of:
(1B1) conducting surface plasma treatment to a lower surface of the first PDMS void layer and an upper surface of the second PDMS layer, and then overlapping a first fabrication having the first PDMS carrier layer, the second 1H, 1H, 2H, 2H-perfluorooctyl-trichlorosilane layer and the first PDMS layer on the second PDMS layer, and heating under 85° C. for at least one hour in order to integrate the first PDMS layer and the second PDMS layer.

12. The method for manufacturing the film fabrication of the rubber material with the piezoelectric characteristics according to claim 9, wherein step (1C) further comprises the step of:
(1C1) utilizing the chemical characteristics of the third 1H, 1H, 2H, 2H-perfluorooctyl-trichlorosilane layer to strip the second PDMS layer having the second PDMS solid layer and the second PDMS void layer from the second mold having the second SU-8 3050 photoresist layer and the second silicon wafer, wherein the second SU-8 3050 photoresist layer and the second silicon wafer are arranged from top to bottom.

13. The method for manufacturing the film fabrication of the rubber material with the piezoelectric characteristics according to claim 9, wherein step (1D) further comprises the step of:
(1D1) providing the bottom PDMS layer with the thickness of 100 μm; and
(1D2) conducting surface plasma treatment to an upper surface of the bottom PDMS layer and a lower surface of the second PDMS void layer of the second PDMS layer, and then overlapping the second PDMS layer on the bottom PDMS layer, and heating under 85° C. for at least one hour in order to integrate the second PDMS layer and the bottom PDMS layer, so as to form a second fabrication having the first PDMS carrier layer, the second 1H, 1H, 2H, 2H-perfluorooctyl-trichlorosilane layer, the first PDMS layer, the second PDMS layer, and the bottom PDMS layer arranged from top to bottom, wherein the first PDMS layer has the first PDMS solid layer and the first PDMS void layer, and the second PDMS layer has the second PDMS solid layer and the second PDMS void layer.

14. The method for manufacturing the film fabrication of the rubber material with the piezoelectric characteristics according to claim 13, wherein step (1D2) further comprises the step of:

(1D2A) inducing a plurality of drops of perfluorooctyl triethoxysilane silane solution into a plurality of inner voids and channels in the second fabrication so as to form a perfluorooctyl triethoxysilane silane adhering layer on each of the inner voids and channels; and (1D2B) inducing a plurality of drops of PTFE (polytetrafluoroethylene) solution into the inner voids and channels in the second fabrication so as to form a PTFE layer on the perfluorooctyl triethoxysilane silane adhering layer, wherein PTFE is a polymeric material, and therefore the PTFE layer is a deposited polymeric film; and (1D2C) the first PDMS carrier layer and the second 1H, 1H, 2H, 2H-perfluorooctyl-trichlorosilane layer taking off the overlapped first PDMS layer, second PDMS layer and bottom PDMS layer, since the bonding strength between the surfaces of the PDMS layers is stronger than the bonding strength between the surfaces that are conducted by surface silane modification.

15. The method for manufacturing the film fabrication of the rubber material with the piezoelectric characteristics according to claim 7, wherein step (3) further comprises the steps of:

(31) forming a first MPTMS adhering layer and a second MPTMS adhering layer on an upper surface of the first PDMS layer and a lower surface of the bottom PDMS layer respectively; and

(32) respectively forming a first elastic gold film on the first MPTMS adhering layer and a second gold elastic gold film on the second MPTMS adhering layer, wherein the first electrode layer has the first MPTMS adhering layer and the first elastic gold film, and the second electrode layer has the second MPTMS adhering layer and the second elastic gold film, an upper surface of the first MPTMS adhering layer being corresponding to a lower surface of the first elastic gold film, a lower surface of the second MPTMS adhering layer being corresponding to an upper surface of the second elastic gold film.

* * * * *